US012614653B2

(12) United States Patent
Nishio et al.

(10) Patent No.: US 12,614,653 B2
(45) Date of Patent: Apr. 28, 2026

(54) FeNi ORDERED ALLOY STRUCTURAL BODY AND METHOD FOR MANUFACTURING THE SAME

(71) Applicant: DENSO CORPORATION, Kariya-city (JP)

(72) Inventors: Takahiro Nishio, Kariya-city (JP); Hiroaki Kura, Kariya-city (JP)

(73) Assignee: DENSO CORPORATION, Kariya-city (JP)

( * ) Notice: Subject to any disclaimer, the term of this patent is extended or adjusted under 35 U.S.C. 154(b) by 383 days.

(21) Appl. No.: 18/351,581

(22) Filed: Jul. 13, 2023

(65) Prior Publication Data

US 2023/0368952 A1     Nov. 16, 2023

Related U.S. Application Data

(63) Continuation of application No. PCT/JP2022/005919, filed on Feb. 15, 2022.

(30) Foreign Application Priority Data

Feb. 16, 2021     (JP) ................................. 2021-022231

(51) Int. Cl.
*H01F 1/147* (2006.01)
*B22F 1/054* (2022.01)
(Continued)

(52) U.S. Cl.
CPC .......... *H01F 1/14741* (2013.01); *B22F 1/056* (2022.01); *B22F 1/142* (2022.01);
(Continued)

(58) Field of Classification Search
CPC .. H01F 1/14741; H01F 1/068; B22F 2998/10; B22F 1/056; B22F 1/142;
(Continued)

(56) References Cited

U.S. PATENT DOCUMENTS

2018/0251867 A1     9/2018   Kura et al.
2020/0325551 A1    10/2020   Kura et al.
2021/0062280 A1     3/2021   Kura et al.

OTHER PUBLICATIONS

Nishio et al., "Fabrication of L1-FeNi films with island structure by nitrogen insertion and topotactic extraction for improved coercivity ," in APL Mater. 9, 091108, Sep. 2021, pp. 1-8. (Year: 2021).*

* cited by examiner

*Primary Examiner* — Michael E. La Villa
(74) *Attorney, Agent, or Firm* — Posz Law Group, PLC

(57)     ABSTRACT

A FeNi ordered alloy structural body includes a support having a surface, and particles disposed on the surface of the support with gaps therebetween. Each of the particles contains an $L1_0$-type FeNi ordered alloy phase. In a method for manufacturing the FeNi ordered alloy structural body, the support is prepared, and particles of an FeNi disordered alloy are dispersed on the surface of the support with gaps therebetween. A nitriding treatment is performed to the particles of the FeNi disordered alloy to form particles in which nitrogen is incorporated. After the nitriding treatment, a denitrification treatment is performed to desorb the nitrogen from the particles, thereby to form the particles containing the $L1_0$-type FeNi ordered alloy phase.

14 Claims, 12 Drawing Sheets

(51) Int. Cl.

| | |
|---|---|
| *B22F 1/142* | (2022.01) |
| *B22F 1/145* | (2022.01) |
| *C21D 6/00* | (2006.01) |
| *C22C 19/03* | (2006.01) |
| *C22C 30/00* | (2006.01) |
| *C22C 33/02* | (2006.01) |
| *C22C 38/08* | (2006.01) |
| *C23C 14/14* | (2006.01) |
| *C23C 14/16* | (2006.01) |
| *C23C 14/18* | (2006.01) |
| *C23C 14/34* | (2006.01) |
| *C23C 14/58* | (2006.01) |
| *C23C 30/00* | (2006.01) |
| *H01F 1/06* | (2006.01) |

(52) U.S. Cl.
CPC .............. *B22F 1/145* (2022.01); *B22F 1/147* (2022.01); *C21D 6/00* (2013.01); *C22C 19/03* (2013.01); *C22C 30/00* (2013.01); *C22C 33/0285* (2013.01); *C22C 38/08* (2013.01); *C23C 14/14* (2013.01); *C23C 14/16* (2013.01); *C23C 14/18* (2013.01); *C23C 14/34* (2013.01); *C23C 14/58* (2013.01); *C23C 14/586* (2013.01); *C23C 14/5873* (2013.01); *C23C 30/00* (2013.01); *C23C 30/005* (2013.01); *H01F 1/068* (2013.01); *B22F 2301/35* (2013.01); *B22F 2304/054* (2013.01); *B22F 2998/10* (2013.01); *Y10T 428/12014* (2015.01); *Y10T 428/12153* (2015.01); *Y10T 428/12451* (2015.01); *Y10T 428/12465* (2015.01); *Y10T 428/12479* (2015.01); *Y10T 428/12944* (2015.01); *Y10T 428/12951* (2015.01)

(58) Field of Classification Search
CPC ...... B22F 1/145; B22F 1/147; B22F 2301/35; B22F 2304/054; C21D 6/00; C22C 19/03; C22C 30/00; C22C 33/0285; C22C 38/08; C23C 14/14; C23C 14/16; C23C 14/18; C23C 14/34; C23C 14/58; C23C 14/586; C23C 14/5873; C23C 30/00; C23C 30/005; Y10T 428/12451; Y10T 428/12465; Y10T 428/12479; Y10T 428/12944; Y10T 428/12951; Y10T 428/12014; Y10T 428/12153
See application file for complete search history.

FIG. 6

| STATE 1:<br>FeNi DISORDERED ALLOY | STATE 2:<br>AFTER NITRIDING | STATE 3:<br>AFTER DENITRIFICATION |
|---|---|---|
| 3a | 3b | 3c   4 |

FIG. 7

| STATE 1:<br>FeNi DISORDERED ALLOY | STATE 2:<br>AFTER NITRIDING | STATE 3:<br>AFTER DENITRIFICATION |
|---|---|---|
| 5    3a | 5    3b | 5    3c |

FIG. 9

| | FORM | FeNi RATIO | SUPPORT | GAP | NITRIDING AND DENITRIFI- CATION | DESIGNED THICKNESS nm | NITRIDE wt% | COERCIVITY Oe | COERCIVITY kA/m |
|---|---|---|---|---|---|---|---|---|---|
| COMPARATIVE EXAMPLE 1 | FeNi SIMULTANEOUS DEPOSITION FILM | 50:50 | QUARTZ SUBSTRATE | EXIST | NONE | 10 | 0 | 324 | 25.8 |
| COMPARATIVE EXAMPLE 2 | FeNi SIMULTANEOUS DEPOSITION FILM | 50:50 | QUARTZ SUBSTRATE | EXIST | NONE | 20 | 0 | 295 | 23.5 |
| COMPARATIVE EXAMPLE 3 | FeNi SIMULTANEOUS DEPOSITION FILM | 50:50 | QUARTZ SUBSTRATE | EXIST | NONE | 30 | 0 | 216 | 17.2 |
| COMPARATIVE EXAMPLE 4 | FeNi SIMULTANEOUS DEPOSITION FILM | 50:50 | QUARTZ SUBSTRATE | EXIST | NONE | 40 | 0 | 187 | 14.9 |
| COMPARATIVE EXAMPLE 5 | FeNi SIMULTANEOUS DEPOSITION FILM | 50:50 | QUARTZ SUBSTRATE | EXIST | NONE | 50 | 0 | 113 | 9.0 |
| COMPARATIVE EXAMPLE 6 | FeNi ALTERNATE DEPOSITION FILM | 50:50 | Si SUBSTRATE AND THERMAL OXIDE FILM | EXIST | NONE | 25.2 | 0 | 401 | 31.9 |
| COMPARATIVE EXAMPLE 7 | FeNi POWDER | 50:50 | NONE | NONE | EXIST | | 60 | 1130 | 89.9 |
| EXAMPLE 1 | FeNi SIMULTANEOUS DEPOSITION FILM | 50:50 | QUARTZ SUBSTRATE | EXIST | EXIST | 10 | 0 | 1160 | 92.3 |
| EXAMPLE 2 | FeNi SIMULTANEOUS DEPOSITION FILM | 50:50 | QUARTZ SUBSTRATE | EXIST | EXIST | 20 | 0 | 2217 | 176.4 |
| EXAMPLE 3 | FeNi SIMULTANEOUS DEPOSITION FILM | 50:50 | QUARTZ SUBSTRATE | EXIST | EXIST | 30 | 11 | 2004 | 159.5 |
| EXAMPLE 4 | FeNi SIMULTANEOUS DEPOSITION FILM | 50:50 | QUARTZ SUBSTRATE | EXIST | EXIST | 40 | 25 | 1691 | 134.6 |
| EXAMPLE 5 | FeNi SIMULTANEOUS DEPOSITION FILM | 50:50 | QUARTZ SUBSTRATE | EXIST | EXIST | 50 | 40 | 1426 | 113.5 |
| EXAMPLE 6 | FeNi ALTERNATE DEPOSITION FILM | 50:50 | Si SUBSTRATE AND THERMAL OXIDE FILM | EXIST | EXIST | 25.2 | 0 | 2245 | 178.6 |

FIG. 15

| STATE 1:<br>FeNi DISORDERED ALLOY | STATE 2:<br>AFTER NITRIDING | STATE 3:<br>AFTER DENITRIFICATION |
|---|---|---|
|  5    3a |  5    3b |  5    3c |

FeNi ORDERED ALLOY STRUCTURAL BODY AND METHOD FOR MANUFACTURING THE SAME

CROSS REFERENCE TO RELATED APPLICATIONS

The present application is a continuation application of International Patent Application No. PCT/JP2022/005919 filed on Feb. 15, 2022, which designated the U.S. and claims the benefit of priority from Japanese Patent Application No. 2021-022231 filed on Feb. 16, 2021. The entire disclosures of all of the above applications are incorporated herein by reference.

TECHNICAL FIELD

The present disclosure relates to an iron-nickel (FeNi) ordered alloy structural body having an $L1_0$ type FeNi ordered alloy phase of an $L1_0$ type ordered structure, and a method for manufacturing the same.

BACKGROUND

An FeNi (iron-nickel) ordered alloy of an $L1_0$ type ordered structure has high uniaxial magnetic anisotropy, and is expected as a magnet material and a material for a magnetic device such as a magnetic recording device, for which no rare earth element and no noble metal are used at all. As a method for manufacturing an $L1_0$ type FeNi ordered alloy having a higher magnitude of ordering, for example, a nitriding treatment in which powder of an FeNi disordered alloy is nitrified with ammonia ($NH_3$) gas is performed, and then a denitrification treatment in which nitrogen is removed from the powder using hydrogen ($H_2$) gas is performed.

SUMMARY

The present disclosure describes an iron-nickel (FeNi) ordered alloy structural body having an FeNi ordered alloy phase of an $L1_0$ type ordered structure, and a method for manufacturing the same. According to an aspect of the present disclosure, an FeNi ordered alloy structural body includes a support having a surface, and particles dispersed on the surface of the support with gaps therebetween, each of the particles containing the FeNi ordered alloy phase of the $L1_0$ type ordered structure. According to an aspect of the present disclosure, a method for manufacturing the FeNi ordered alloy structural body includes: preparing the support; forming particles of an FeNi disordered alloy to be dispersed on the surface of the support; performing a nitriding treatment to the particles of the FeNi disordered alloy to form particles in which nitrogen is incorporated; and after the performing of the nitriding treatment, performing a denitrification treatment to desorb the nitrogen from the particles, thereby to form the particles containing the $L1_0$ type FeNi ordered alloy phase of the $L1_0$ type ordered structure.

BRIEF DESCRIPTION OF DRAWINGS

Features and advantages of the present disclosure will become more apparent from the following detailed description made with reference to the accompanying drawings, in which:

FIG. 6 is a diagram illustrating states of particles when a nitriding treatment and a denitrification treatment are performed to particles of an FeNi disordered alloy;

FIG. 7 is a diagram illustrating states of particles when a nitriding treatment and denitrification treatment are performed to particles of an FeNi disordered alloy disposed on a substrate with gaps therebetween, in which one side being 600 nm;

FIG. 9 is a diagram illustrating production conditions, evaluation results, and the like of examples 1 to 6 and comparative Examples 1 to 7;

FIG. 15 is a diagram illustrating TEM observation images of particles of an FeNi disordered alloy that are arranged on a substrate with gaps therebetween and subjected to a nitriding treatment and a denitrification treatment;

DETAILED DESCRIPTION

Figure 1:
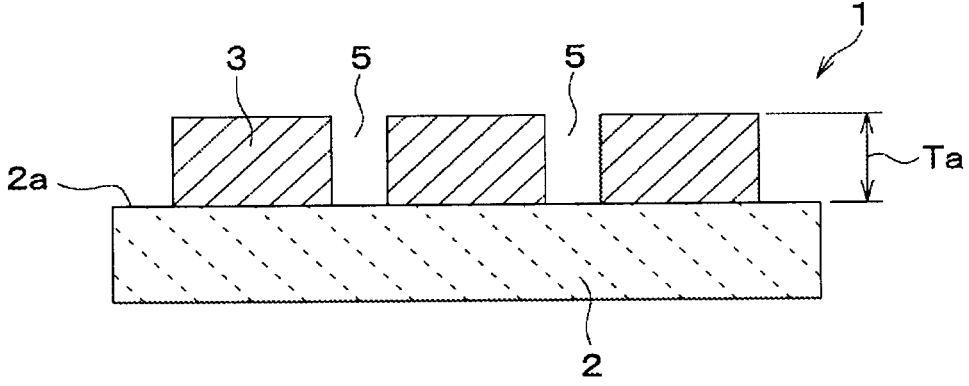
FIG. 1 is a diagram illustrating a cross-sectional view of an FeNi ordered alloy structural body including particles containing an $L1_0$ type FeNi ordered alloy phase according to a first embodiment.

To begin with, a relevant technology will be described only for understanding the embodiments of the present disclosure.

As a method for manufacturing an $L1_0$ type FeNi ordered alloy having a higher magnitude of ordering, it has been known to perform a nitriding treatment and denitrification treatment to powder of an FeNi disordered alloy. In the nitriding treatment, powder of the FeNi disordered alloy is nitrified with ammonia ($NH_3$) gas. In the denitrification treatment performed after the nitriding treatment, nitrogen is removed from the powder using hydrogen ($H_2$) gas.

In such a method, however, a high coercive force may not be obtained.

In such a method, ordered FeNiN is produced by nitriding the powder of the FeNi disordered alloy as a precursor in the nitriding treatment, and then nitrogen is removed from the FeNiN ordered alloy by the denitrification treatment, thereby to produce the FeNi ordered alloy. In the production of ordered FeNiN, the grain bonding proceeds as crystallization proceeds. Then, a sintered portion is formed in a portion where the grains are in contact with each other. Further, when the denitrification treatment is performed, crystal disorder occurs in the sintered portion. For example, a random phase connected in a state where a stacked structure of FeNi is collapsed is thus generated. The generated random phase is a soft magnetic component whose magnetization is easily reversed with respect to an external magnetic field. When the material contains such a soft magnetic component, the position of the soft magnetic component results in a starting point of magnetization reversal, and thus the coercive force of the entire material decreases.

The present disclosure provides an FeNi ordered alloy structural body having an $L1_0$ type FeNi ordered alloy phase, which can achieve a higher coercive force, and a method for manufacturing the same.

According to an aspect of the present disclosure, an FeNi ordered alloy structural body having an $L1_0$ type FeNi ordered alloy phase includes a support, and particles dispersed on a surface of the support with gaps therebetween, the particles each containing the FeNi ordered alloy phase of an $L1_0$ type ordered structure.

In such an FeNi ordered alloy structural body, each particle can be isolated in a form close to a single crystal, and generation of a random phase can be suppressed. Therefore, a high coercive force can be achieved.

According to another aspect of the present disclosure, a method for manufacturing an FeNi ordered alloy structural body having an $L1_0$ type FeNi ordered alloy phase includes: preparing a support having a surface; forming particles of an FeNi disordered alloy to be dispersed with gaps therebetween on the surface of the support; performing a nitriding treatment to the particles of the FeNi disordered alloy so as to form particles in which nitrogen is incorporated; after the performing the nitriding treatment, performing a denitrification treatment to desorb the nitrogen from the particles, thereby to form particles containing the $L1_0$ FeNi ordered alloy phase of an $L1_0$ ordered structure.

In such a method, nitrogen can be desorbed through the gap. Therefore, it is possible to obtain particles in which nitrogen is suppressed from remaining, and it is possible to obtain a high coercive force.

Embodiments of the present disclosure will be described with reference to the drawings. In the following description of the embodiments, the same or equivalent parts are denoted by the same reference numerals.

First Embodiment

A first embodiment will be described. An $L1_0$ type FeNi ordered alloy phase according to the present embodiment, that is, an FeNi ordered alloy structural body having an FeNi superlattice is applied to a magnet material and a device material for a device such as a magnetic storage and a magnetic sensor, and has a high coercive force and excellent magnetic characteristics.

As shown in FIG. 1, an FeNi ordered alloy structural body 1 of the present embodiment has a configuration in which a large number of particles 3 of an FeNi ordered alloy are dispersed with gaps 5 therebetween into the shape of island on a surface 2a of a substrate 2.

The substrate 2 serves as a support body that supports the particles 3. In this example, a quartz substrate made of silicon dioxide ($SiO_2$) which is inert to $NH_3$ is used as the substrate 2. However, the substrate 2 may be made of another material, for example, a silicon (Si)-containing substrate containing Si, such as a silicon (Si) substrate or a silicon nitride (SiN) substrate. As the substrate 2, a substrate in which a thermal oxide film or the like is disposed on a surface of a Si-containing substrate such as a silicon substrate may be used. As the material forming the substrate 2, a material having a coefficient of linear expansion in consideration of volume expansion and volume contraction due to a nitriding treatment and a denitrification treatment, which will be described later, is selected. For example, when the substrate 2 is formed of a quartz substrate, the coefficient of linear expansion is $0.6 \times 10^{-6}$/K.

The particle 3 is configured to include an $L1_0$ type FeNi ordered alloy phase. The particle 3 is preferably configured so that the whole of the particle 3 is made of the $L1_0$ type FeNi ordered alloy phase. Further, the particle 3 may be configured to partially include another atom or another phase.

Figure 2:
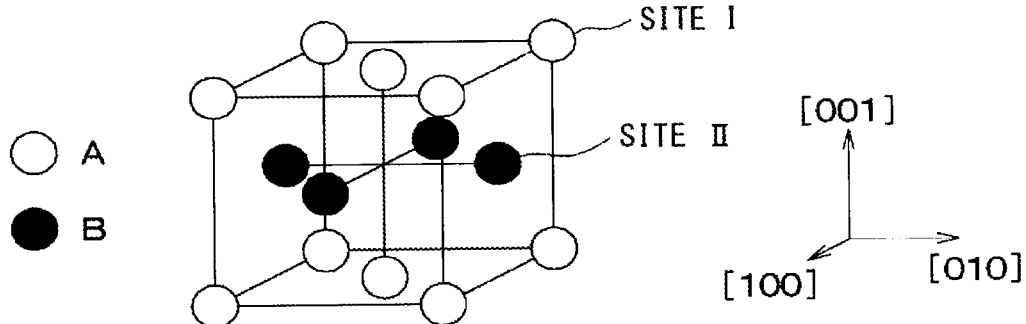
FIG. 2 is a diagram illustrating an $L1_0$ type ordered structure.

Here, the $L1_0$ type ordered structure is a structure based on a face-centered cubic lattice, and has a lattice structure as shown in FIG. 2. In FIG. 2, an utmost upper layer in a stacking structure on a [001] plane of the face-centered cubic lattice is defined as site I, and a middle layer disposed between the upmost upper layer and an utmost lower layer is defined as site II. In this case, an existing proportion of metal A at the site I is defined as x, and an existing proportion of metal B at the site I is defined as (1-x). The existing ratio of metal A and metal B at the side I is expressed as $A_xB_{1-x}$. Similarly, an existing proportion of metal at the site II is defined as x, and an existing proportion of metal A at the site II is defined as (1-x). The existing ratio of metal A and metal B at the site II is expressed as $A_{1-x}B_x$. Here, x satisfies a relationship of $0.5 \leq x \leq 1$.

Figure 3:
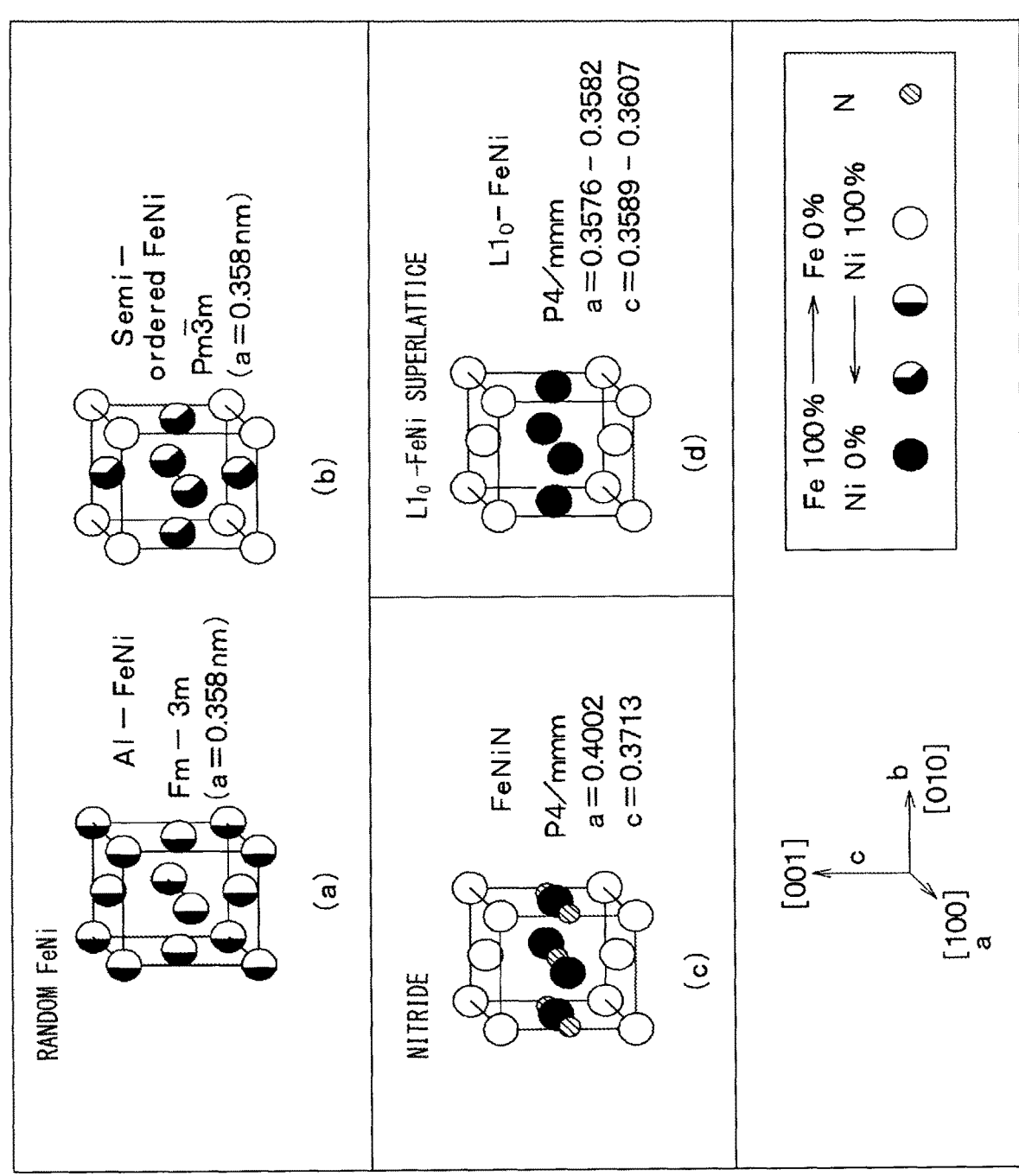
FIG. 3 is a diagram illustrating lattice structures in a process of manufacturing an FeNi ordered alloy.

In this case, it is assumed that the metal A is represented by Ni, the metal B is represented by Fe. Thus, Ni is indicated by a white circle, and Fe is indicated by a black circle. In this regard, a completely white circle indicates that the proportion of Ni is 100% and the proportion of Fe is 0%, and a completely black circle indicates that the proportion of Ni is 0% and the proportion of Fe is 100%. As shown in FIG. 3 to be described later, a circle with mixture of white and black indicates that both Fe and Ni are contained. For example, a circle composed of half white and half black indicates that the proportion of Ni is 50% and the proportion of Fe is 50%. In the present embodiment, the $L1_0$ type FeNi ordered alloy phase contained in the particle 3 has a composition ratio of Fe and Ni of approximately 50:50, and has a structure shown in (d) of FIG. 3.

Each particle 3 is an isolated particle and is preferably magnetically isolated. The state of "magnetically isolated" means that the magnetic interaction with the adjacent particles is weakened and that it can behave like a magnet of a single particle. If there is no interaction, magnetization reversal is less likely to occur even if the particle 3 has a soft magnetic particle portion serving as a starting point of magnetization reversal.

In addition, the particle size, in other words, the particle diameter of each particle 3 is equivalent to the crystallite size of 5 nm to 200 nm, and each particle 3 is in an isolated state in a form close to a single crystal. The size of the single magnetic domain of the $L1_0$ type FeNi ordered alloy is 50 nm to 200 nm, and the particle 3 has that size. However, the size of the particle 3 may be about 5 nm, which is smaller than the size of the single magnetic domain, because the particle 3 is not likely to be multi-magnetic domains even if the size of the particle 3 is that size. The reason why the particle size is 5 nm or more is that a portion of the natural oxide film formed with a thickness of several nm is included, and it is sufficient that the particle size excluding the natural oxide film is 0.36 nm or more of the FeNi basic unit cell. As the particles 3, particles having a particle size of 5 nm or less may be partially contained, or all particles 3 may have a particle size of 5 nm or less. On the other hand, when the particle size exceeds the single magnetic domain size, it is easy to form multiple magnetic domains. Thus, it is preferable that the particle size is 200 nm or less. In addition, each particle 3 is brought into close contact with the substrate 2, and the thickness of the particle 3 in a normal direction with respect to the surface 2a of the substrate 2, that is, the dimension in the normal direction of the particle 3 is larger than the same size as the $NH_3$ molecule and is equal to or smaller than several hundred times the $NH_3$ molecule size. The thickness of each particle 3 is preferably 75 nm or less, and more preferably 50 nm or less. A gap 5 is formed between respective particles 3. The gap 5 is larger than the $NH_3$ molecule size of 0.26 nm. That is, the gap 5 has the size that allows the $NH_3$ molecule to pass therethrough. According to the experimental results, the gap 5 had a portion having a dimension of 0.3 nm or more, and was generally 0.3 nm or more. More specifically, on the surface 2a of the substrate 2, one or more gaps 5 are formed in an area that is larger than the basic unit lattice and smaller than 1000 times the basic unit lattice, for example, in an area having a diameter of 300 nm. That is, even if the particle size of the particle 3 is 200 nm, which is the largest crystallite size, the gap 5 is formed at a density such that the gap 5 is present at least in an area of a diameter of 300 nm on the surface 2a of the substrate 2.

In the FeNi ordered alloy structural body 1 having a structure in which the particles 3 are dispersed into an island shape, that is, islanded, with respect to the substrate 2 configured as described above, each particle 3 is in an isolated state in a form close to a single crystal, and generation of a random phase is suppressed. Therefore, a high coercive force is obtained. For example, as shown in examples described later, a high coercive force of 1160 Oe (i.e., 92.3 kA/m) or more can be obtained.

Next, a method for manufacturing the $L1_0$ type FeNi ordered alloy structural body 1 configured as described above will be described.

Figure 4:
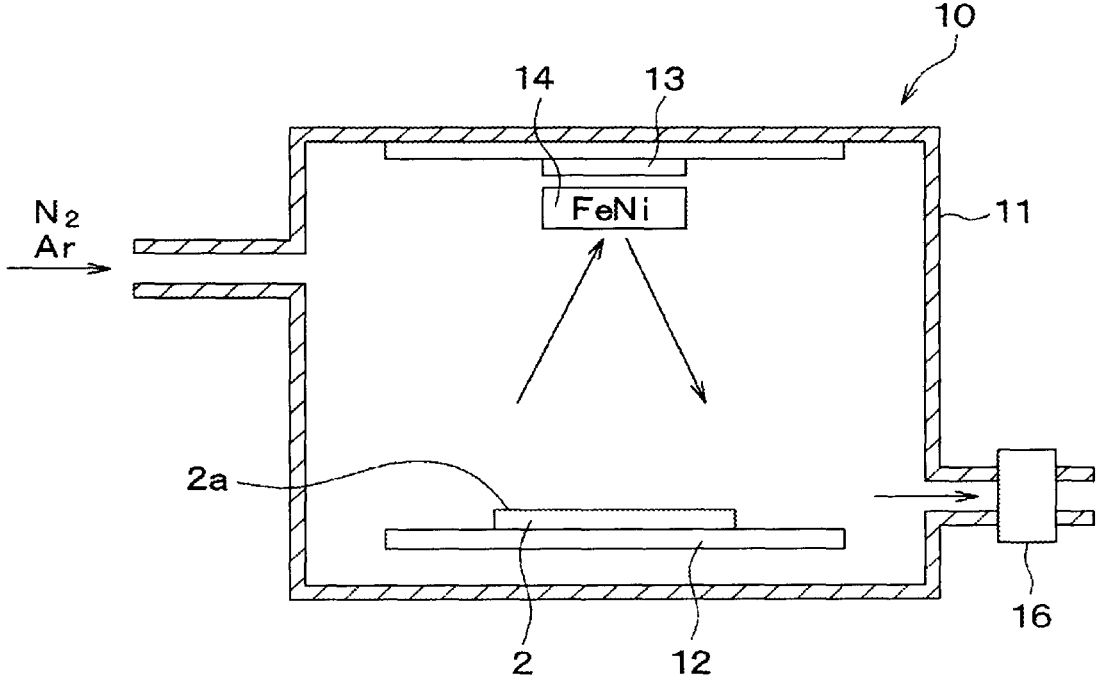
FIG. 4 is a diagram illustrating a schematic cross-sectional view of a sputtering apparatus used for forming particles containing an FeNi alloy as a precursor on a substrate.

First, a substrate 2 is prepared, and a sputtering apparatus 10 shown in FIG. 4 is prepared. As the substrate 2, for example, a quartz substrate having a size of 5 mm square and a thickness of 0.5 mm is prepared. As the sputtering apparatus 10, for example, an RF magnetron sputtering apparatus can be used. Then, the substrate 2 is placed on a counter electrode 12 provided in a vacuum chamber 11 of the sputtering apparatus 10. In addition, an FeNi alloy 14 containing an Fe material and a Ni material serving as targets is disposed in the vicinity of the magnet 13 for plasma generation in the vacuum chamber 11. As the FeNi alloy 14, it is preferable to use an alloy having high purity and having a chemical composition ratio is the same between Fe and Ni. In this case, the FeNi alloy 14 having the size of two inches and in which the proportion of Fe and Ni is highly 99.99% and the chemical composition ratio of Fe and Ni is 50:50 is used.

Thereafter, the inside of the vacuum chamber 11 is set to a vacuum degree of $2\times10^{-5}$ [Pa] or less by using the vacuum pump 16, and the substrate 2 is heated to 200 to 600 degrees Celsius (° C.), for example, 400° C. while the vacuum degree is maintained. Then, argon (Ar) gas for sputtering is introduced into the vacuum chamber 11 at 0.01 to 2 Pa, for example, 0.3 Pa, and the high frequency application output is set to 10 to 200 W. Accordingly, atoms, clusters, and ions of Fe and Ni are generated from the FeNi alloy by the sputtering action of Ar turned into plasma, and Fe and Ni are deposited on the surface 2a of the substrate 2 to form the FeNi alloy. The FeNi alloy at this time may be an FeNi disordered alloy or a part thereof may be an FeNi ordered alloy. Alternatively, nitrogen may be contained in the FeNi alloy by using plasma containing nitrogen.

In this case, the deposition rate of FeNi is arbitrary, and Fe and Ni may be deposited simultaneously or alternately for each atomic layer. In this case, for example, the deposition rate is 0.099 nm/sec. In addition, the thickness of the particle of the FeNi disordered alloy is adjusted by adjusting the sputtering time or the like so that the thickness of the particles in the denitrification treatment performed later is 75 nm or less, preferably 50 nm or less.

In addition, if the temperature of the substrate 2 is low or the deposition rate is low during sputtering, the FeNi disordered alloy is likely to be deposited in layers. On the other hand, since the temperature is set to a high temperature of 200 to 600° C., the particles of the FeNi disordered alloy are likely to be formed into islands. Of course, at this time, a part of the alloy may be an FeNi ordered alloy, or nitrogen may be contained in the FeNi alloy.

As a result, as in a state 1 of FIG. 7 described later, the FeNi disordered alloy particles 3a can be formed so as to be dispersed or dotted on the surface 2a of the substrate 2. Here, the FeNi disordered alloy has a random phase in which the arrangement of Fe and Ni atoms does not have regularity. The random phase is a phase in which Fe atoms and Ni atoms are exchanged from the FeNi ordered phase of the $L1_0$ type, and has a structure as shown in (a) or (b) of FIG. 3. In these structures, the distance a between atoms in the [100] direction was 0.358 nm (a=0.358).

The FeNi disordered alloy thus formed was subjected to composition analysis using a fluorescent X-ray analyzer, for example, M4 TORNADO manufactured by BRUKER. As a result, the FeNi disordered alloy had the FeNi ratio of Fe:Ni=50:50. The particle size of each particle 3a of the FeNi disordered alloy was 5 to 200 nm, and the gap 5 of 0.3 nm or more was formed between the respective particles 3a. The gap 5 is preferably formed in the entire region in between the adjacent particles 3a, but may be partially 0.3 nm or less. In addition, it is sufficient that the adjacent particles 3a are substantially not in contact with each other. Even if the adjacent particles 3a are locally in contact with each other, it is sufficient that the size of the gap 5 is about a fraction of the particle size of the particle 3a and the gap 5 is formed at other locations.

Figure 5:
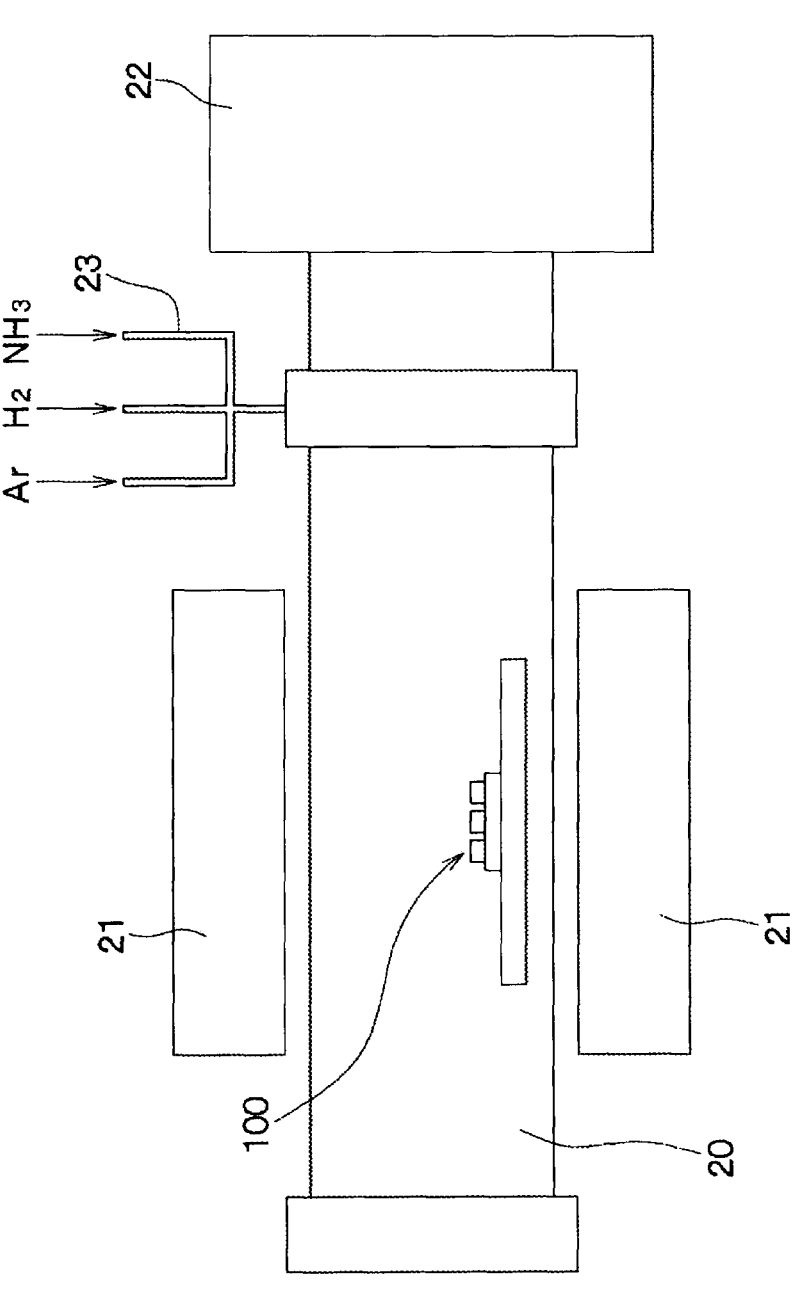
FIG. 5 is a diagram illustrating a schematic configuration of a nitriding and denitrification treatment apparatus.

Subsequently, a sample in which the particles 3a of the FeNi disordered alloy are arranged on the surface 2a of the substrate 2 is subjected to a nitriding treatment and a denitrification treatment. Specifically, the nitriding treatment and the denitrification treatment are performed using, for example, a nitriding and denitrification treatment apparatus shown in FIG. 5. The nitriding and denitrification treatment apparatus includes a tubular furnace 20 as a heating furnace heated by a heater 21 and a glove box 22 for placing a sample in the tubular furnace 20. In addition, the nitriding and denitrification treatment apparatus includes a gas introduction unit 23 that selectively introduces nitrogen gas as a purge gas, $NH_3$ gas for the nitriding treatment, and $H_2$ gas for the denitrification treatment into the tubular furnace 20.

The nitriding treatment and the denitrification treatment using such a nitriding and denitrification treatment apparatus are performed as follows. First, a sample 100 in which powder 3a of the FeNi disordered alloy is disposed on the surface 2a of the substrate 2 is placed in the tubular furnace 20. In the nitriding treatment, the $NH_3$ gas is introduced into the tubular furnace 20 to make the inside of the tubular furnace 20 an $NH_3$ atmosphere or an active nitrogen atmosphere in which an active nitrogen source such as a nitrogen plasma atmosphere can be generated, and the particles 3a of the FeNi disordered alloy are heated and nitrified at a predetermined temperature for a predetermined time. As a result, as shown in a state 2 of FIG. 7 described later, particles 3b in which N is incorporated into FeNi are generated.

At this time, N is incorporated into the particle 3a of the FeNi disordered alloy by the nitriding treatment, thereby causing the ordering of the crystal. Preferably, when FeNiN as a FeNi compound is produced, the structure of the metal element arrangement of the FeNi ordered alloy can be obtained at the stage of nitriding treatment. As shown in (c) in FIG. 3, FeNiN has an ordered structure in which Ni atoms are arranged at the site I and Fe atoms are arranged at the site II, and N atoms are arranged between Fe atoms at the site II. In this structure, the distance a between atoms in the [100] direction was 0.4002 nm (a=0.4002) and the distance c between atoms in the [001] direction was 0.3713 nm (c=0.3713).

Further, the nitriding treatment at this time may be performed by only one heat treatment at a predetermined temperature in an active nitrogen atmosphere. However, it is preferable to perform a high-temperature heat treatment in an active nitrogen atmosphere or a nitrogen or vacuum atmosphere for the second time as an additional high-temperature treatment or a second heat treatment. Specifically, the first heat treatment in an active nitrogen atmosphere is performed at a temperature in the range of 200 to 400° C., and the second heat treatment is performed at a temperature equal to or higher than the temperature of the first heat treatment. For example, the first heat treatment is performed at 325° C. for 20 hours, and the second heat treatment is performed at 375° C. for 20 hours. The first heat treatment in the active nitrogen atmosphere and the second heat treatment at a high temperature may be repeated.

As described above, when the first heat treatment in the active nitrogen atmosphere is performed at a relatively low temperature, particularly in the case of the $NH_3$ gas, FeNiN is easily generated when N is incorporated into FeNi while obtaining a metal element structure of the FeNi ordered alloy at the stage of the nitriding treatment. When the nitriding treatment is performed at a high temperature in athe $NH_3$ gas atmosphere, the $NH_3$ decomposition reaction ($2NH_3=N_2+3H_2$) used at the time of the nitriding treatment is promoted on the FeNi metal surface, and FeNiN is less likely to be generated. Therefore, the first heat treatment in the $NH_3$ gas atmosphere is preferably performed at a relatively low temperature. In addition, by performing the second heat treatment in the active nitrogen atmosphere, nitrogen, or a vacuum atmosphere at a relatively high temperature, crystal growth of FeNiN occurs. Thus, it is possible to further increase the particle size and to further improve the crystallinity. The particle 3b after the nitriding treatment has a larger particle size than the particle 3a before the nitriding treatment. However, since the thickness of the particles 3a are adjusted when the particles 3a of the FeNi disordered alloy are arranged as described above, the thickness of the particle 3b after the nitriding treatment can be 75 nm or less, preferably 50 nm or less.

Thereafter, in the denitrification treatment, the $H_2$ gas is introduced into the heating furnace to make the inside of the tubular furnace 20 an $H_2$ atmosphere, and the sample 100, which has been subjected to the nitriding treatment, is heated at a predetermined temperature for a predetermined time to remove nitrogen. As a result, as shown in a state 3 of FIG. 7 described later, the particle 3c having the $L1_0$ type FeNi ordered alloy phase is obtained. Thus, the FeNi ordered alloy structural body 1 according to the present embodiment is obtained. As shown in (d) of FIG. 3, the $L1_0$ type FeNi ordered alloy phase obtained at this time has a structure in which N has been desorbed from the site II, and Ni and Fe are arranged, respectively, in the site I and in the site II in the ordered manner. In this structure, the distance a between atoms in the [100] direction was 0.3576 to 0.3582 nm (a=0.3576 to 0.3582), and the distance c between atoms in the [001] direction was 0.3589 to 0.3607 nm (c=0.3589 to 0.3607).

In this case, the FeNi ordered alloy is produced by performing the denitrification treatment after the ordered structure is made to have an $L1_0$ type ordered structure by the nitriding treatment. If the ordered alloy is merely granular, a sintered portion is produced, and randomization is likely to proceed. Specifically, as shown in FIG. 6, when FeNi disordered alloy particles 3a serving as a precursor are prepared in the state 1 and the nitriding treatment is performed at 200 to 400° C., particles 3b of the FeNiN ordered alloy are generated and crystallization proceeds in the state 2. At this time, the crystal orientations of the respective particles 3b are not aligned, and bonding proceeds in a state in which the crystal orientations are different. Further, since each particle 3b is in a simple granular state, the diffusion direction of the particle 3b becomes three-dimensional, and the particle 3b is in a state of being freely movable. As such, the adjacent particles 3b are more easily bonded to each other. Thereafter, when the denitrification treatment is performed at 100 to 300° C., nitrogen is desorbed from the particles 3b of the FeNiN ordered alloy, and the particles 3c of the FeNi ordered alloy of the $L1_0$ type are generated.

When this denitrification treatment is performed, a sintered portion 4 is formed in a portion where the particles 3c are in contact with each other as the state 3, and a random phase in which crystal disorder occurs in the sintered portion 4, for example, the random phase in which the stacked structures of FeNi are connected to each other in the collapsed state is generated. The generated random phase is soft magnetic in which magnetization is easily reversed with respect to an external magnetic field. When a soft magnetic component is contained in the material, this location becomes a starting point of magnetization reversal, and the coercive force of the entire material decreases. In addition, since the particles 3c having different crystal orientations are bonded to each other, the magnetic anisotropy decreases, which causes a decrease in coercive force.

On the other hand, in the case where the FeNi disordered alloy particles 3a are disposed on the surface 2a of the substrate 2 with gaps therebetween and the nitrification treatment and the denitrification treatment are performed to produce an $L1_0$ type FeNi ordered alloy as in the present embodiment, since the particles 3b are disposed with the gaps therebetween, the particles 3b act as follows. The action will be described with reference to FIG. 7.

First, as shown in the state 1 of FIG. 7, in the state where the particles 3a of the FeNi disordered alloy are arranged on the surface 2a of the substrate 2, there are the gaps 5 between the particles 3a of the FeNi disordered alloy. At this time, the gap 5 between the particles 3a is approximately 0.3 nm or more even if the gap 5 is partially narrowed.

Next, when the nitriding treatment is performed in this state, particles 3b in which N is incorporated into FeNi are generated, as shown in state 2 of FIG. 7, and crystal growth is also performed. Even in this case, the gap 5 between the particles 3b is approximately 0.3 nm or more even if the gap 5 is partially narrowed. Due to the incorporation of N and crystal growth, the particles 3b expand in volume, as compared to the particles 3a of the FeNi disordered alloy. In particular, in the case where the nitriding treatment includes two heat treatments performed at different temperatures in the nitrogen atmosphere, crystal growth occurs, and the gap 5 between the particles 3b becomes larger. Specifically, the particles 3a of the FeNi disordered alloy shown in the state 1 of FIG. 7 are not only present in the form of islands but also some present in the form of microparticles (not shown) around the islands. The crystal growth is performed in such a manner that the microparticles are incorporated into the island-shaped particle. Therefore, the gap 5 between the particles 3b becomes larger.

In particular, in the present embodiment, the material of the substrate 2 has a coefficient of linear expansion smaller than that of FeNi. Therefore, when the temperature decreases after the nitriding treatment, the gap 5 tends to become larger. This will be described, with reference to FIGS. 8A and 8B, by comparing a comparative example in which the substrate 2 is made of a material having a coefficient of linear expansion larger than that of FeNi and a case in which the substrate 2 is made of the material having the coefficient of linear expansion smaller than that of FeNi as in the present embodiment.

Figure 8A:
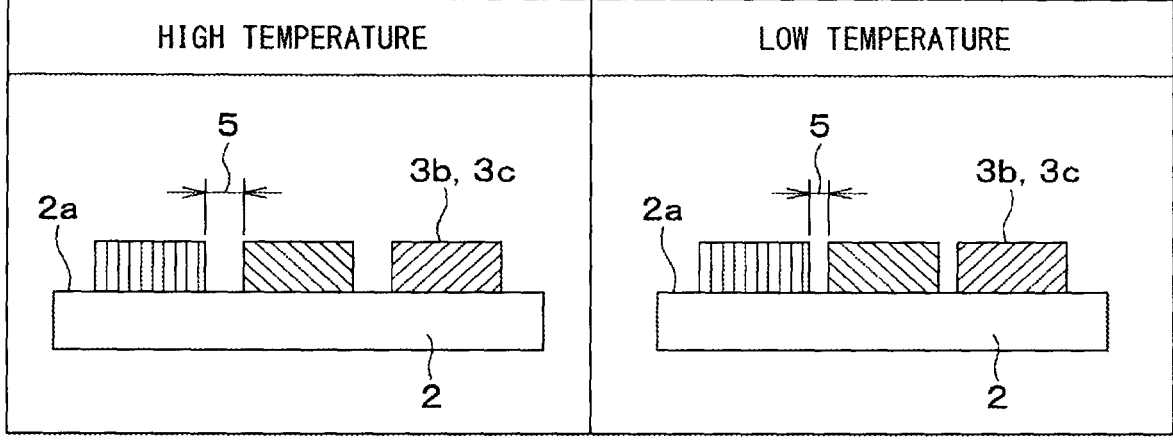
FIG. 8A is a diagram illustrating a change in the gaps when a substrate is made of a material having a coefficient of linear expansion larger than that of FeNi.
Figure 8B:
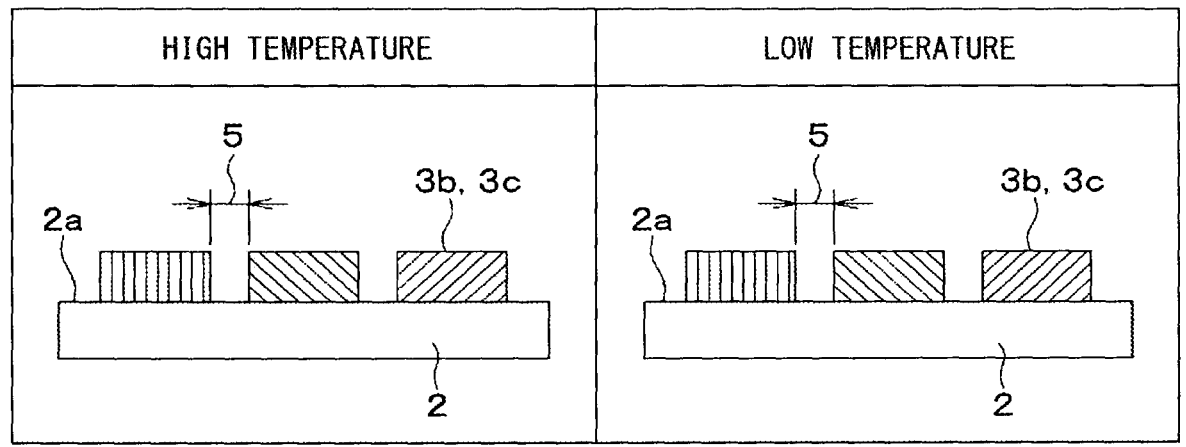
FIG. 8B is a diagram illustrating a change in the gaps when the substrate is made of a material having a coefficient of linear expansion smaller than that of FeNi.

In the case of the comparative example shown in FIG. 8A, the gap 5 becomes larger because the substrate 2 thermally expands more than the particles 3b and 3c at a high temperature in the nitriding treatment and the denitrification treatment. However, the gap 5 becomes narrower because the substrate 2 thermally contracts more than the particles 3b and 3c at a low temperature. On the other hand, in the case of the present embodiment shown in FIG. 8B, when the temperature is changed to the low temperature from the high temperature of the nitriding treatment and the denitrification treatment, the particles 3b and 3c thermally contract more than the substrate 2, so that the gap 5 becomes larger than that at least at the high temperature. That is, even if the temperature is lowered after the nitriding treatment and the denitrification treatment, the gap 5 formed between the particles 3a at the time of deposition of the FeNi disordered alloy is likely to be widened. Therefore, the particles 3 can be easily separated and magnetically isolated.

In order to obtain such an effect, it is sufficient that the coefficient of linear expansion of the material constituting the substrate 2 is lower than the coefficient of linear expansion of FeNi. As described above, since the coefficient of linear expansion of FeNi is about $9.0 \times 10^{-6}$/K, it is sufficient that the coefficient of linear expansion of the material of the substrate 2 is smaller than that. Further, the substrate 2 is preferably made of FeNi nitride, for example, a material having a coefficient of linear expansion smaller than that of FeNiN. The FeNi nitride has different coefficients of linear expansion in the a-axis direction and the c-axis direction, and the coefficient of linear expansion in the a-axis direction is about $14.0 \times 10^{-6}$/K and the coefficient of linear expansion in the c-axis direction is about $5.0 \times 10^{-6}$/K. In the FeNi nitride, since the axial direction is random for each particle, the substrate 2 may be formed of a material having the coefficient of linear expansion smaller than about $9.5 \times 10^{-6}$/K taken as an average. Although the axial direction at the interface with the substrate 2 is not necessarily the c-axis, since the coefficient of linear expansion in the c-axis direction is the smallest, the substrate 2 is preferably formed of a material having the coefficient of linear expansion smaller than about $9.5 \times 10^{-6}$/K, so that the effects described above can be surely achieved.

Then, when the denitrification treatment is performed, as shown in state 3 of FIG. 7, N is desorbed from the particles 3b into which N has been incorporated, and particles 3c containing the $L1_0$ type FeNi ordered alloy phase of the $L1_0$ type ordered structure are generated. The particles 3c at this time correspond to the particles 3 formed on the substrate 2 constituting the FeNi ordered alloy structural body 1 shown in FIG. 1. In the particle 3c, volume contraction occurs due to the desorption of N, and the particle 3c is cut at a grain boundary portion or an amorphous portion having a weak bonding force. Thus, the volume of the particles 3c is smaller than that of the particle 3b in which N is incorporated. In addition, the particles 3c can be isolated in a form close to a single crystal. Even in this case, the gap 5 between the particles 3c is approximately 0.3 nm or more even if it is partially narrowed, and the gap 5 becomes wider as a whole than before the denitrification treatment shown in the state 3 of FIG. 7.

In the denitrification treatment, $H_2$ and N are reacted to be $NH_3$ and N is desorbed. At this time, when the gap 5 between the particles 3b in which N has been incorporated into FeNi has a size that allows the $NH_3$ molecules to pass therethrough, the $NH_3$ molecules are discharged through the gap 5 by moving only by a distance from the inside of each particle 3b to the gap 5. Further, since the thickness of the particles 3b is set to 75 nm or less, preferably 50 nm or less, N can be easily desorbed from the top of the particles 3b. Therefore, denitrification can be performed at a lower temperature in a shorter time.

Further, it is less likely that N will remain in the particle 3c containing the $L1_0$ type FeNi ordered alloy phase. Thus, the particle 3c can be made to contain the $L1_0$ type FeNi ordered alloy phase with higher purity. In addition, since the particles 3a to 3c are arranged on the substrate 2 by securing the gaps 5 having a size that allows the $NH_3$ molecules to pass therethrough, the diffusion of the particles 3a to 3c is regulated, and the particles 3a to 3c are not diffused three-dimensionally but spread two-dimensionally. Therefore, it is possible to suppress contact between adjacent particles, and it is possible to suppress generation of a sintered portion in which a random phase having crystal disorder is generated. As such, the coercive force can be increased.

Next, characteristics including magnetic characteristics and the like of the FeNi ordered alloy structural body 1 including the $L1_0$ type FeNi ordered alloy phase, which are obtained by the above-described manufacturing method, will be described with reference to examples 1 to 6 and comparative examples 1 to 7 shown in FIG. 9. The magnetic characteristics of each example are obtained using, for example, a vertical Kerr loop measurement device manufactured by Neoarc Corporation and a small refrigerant-free type PPMS VersaLab manufactured by Quantum Design Inc.

In FIG. 9, the examples 1 to 5 each show the FeNi ordered alloy structural body 1 manufactured by the manufacturing method described above, that is, by a manufacturing process in which the FeNi disordered alloy particles 3a are disposed to be dispersed in an island shape on the substrate 2 and then the nitriding treatment and the denitrification treatment are performed. In the examples 1 to 5, a designed film thickness of the particles 3 included in the FeNi ordered alloy structural body 1 to be finally obtained was differentiated, but the other conditions were the same. In the example 6, the substrate 2 was provided by a silicon substrate having a thermal oxide film on the surface thereof, and the particles 3 were formed by alternate deposition of Fe and Ni. Thus, the example 6 was different on these points from the examples 1 to 5, but the other conditions are the same as those of the examples 1 to 5. The comparative examples 1 to 5 show cases where the FeNi disordered alloy particles 3a were disposed to be dispersed in an island shape on the substrate 2, but the nitriding treatment and the denitrification treatment were not performed thereafter. The designed film thicknesses of the particle 3 of the comparative examples 1 to 5 were the same as those of the examples 1 to 5, respectively. The comparative example 6 shows a case where the nitriding treatment and the denitrification treatment were not performed with respect to the example 6. The comparative example 7 shows a case where FeNi disordered alloy powder was produced simply without using the substrate 2 serving as a support, and then nitriding treatment and denitrification treatment were performed.

In each of the examples 1 to 5 and the comparative examples 1 to 5, a quartz substrate was used as the substrate 2. The quartz substrate has a coefficient of linear expansion about $0.6 \times 10^{-6}$/K. The coefficient of linear expansion of FeNi is about $9.0 \times 10^{-6}$/K, and the coefficient of linear expansion of the quartz substrate is smaller than that of FeNi. In the comparative example 6 and the example 6, the substrate 2 provided by forming a thermal oxide film of 100 nm on the surface of a silicon substrate was used, and a total coefficient of linear expansion of the silicon substrate and the thermal oxide film was $3.4 \times 10^{-6}$/K. Further, the silicon substrate was p-type, and the electrical resistivity was 1 to 50 Ωcm. Two targets of Fe and Ni each having a purity of 99.99% or more were used, and vapor deposition was alternately performed every 0.18 nm at a deposition temperature of 400° C. For example, the particles 3a were formed by depositing Fe at a deposition rate of 0.0099 nm/sec, and Ni at a deposition rate of 0.0092 nm/sec, as an example, so that the thickness of the particle 3a was 25.2 nm. The chemical composition ratio of Fe and Ni was Fe:Ni=50:50. The "designed film thickness" is a thickness of a film when being formed into a film shape at the time of vapor deposition. However, the particles 3a are formed into islands, that is, islanded into the particles 3a after the vapor deposition, the actual thickness of the particles 3a after islanded is about 1.5 times the designed film thickness at the maximum. Of course, not all of the thicknesses of the particles 3a are about 1.5 times the designed film thickness, and some of the thicknesses are equal to or less than the designed film thickness.

As shown in FIG. 9, the comparative example 1 had the coercive force of 324 Oe (i.e., 25.8 kA/m), and the comparative example 2 had the coercive force of 295 Oe (i.e., 23.5 kA/m). In addition, the comparative example 3 had the coercive force of 216 Oe (i.e., 17.2 kA/m), and the comparative example 4 had the coercive force of 187 Oe (i.e., 14.9 kA/m). The comparative example 5 had the coercive force of 113 Oe (i.e., 9.0 kA/m), and the comparative example 6 had the coercive force of 401 Oe (i.e., 31.9 kA/m). In the comparative examples 1 to 5, since the designed film thickness of the particles 3a of the FeNi disordered alloy was differentiated in the range from 10 to 50 nm, there were differences in the coercive force. However, none of the comparative examples 1 to 5 had a desired coercive force. In the comparative examples 1 to 6, since the nitriding treatment and the denitrification treatment were not performed, the nitride ratio was 0 wt %.

In the comparative example 7, the coercive force was 1130 Oe (i.e., 89.9 kA/m), which was a large value. However, when the nitride ratio was confirmed, it was 60 wt %. That is, it was found that a large amount of N remained. It is considered that the remaining of a large amount of N was caused because the particles of the powder containing the FeNi ordered alloy phase after the nitriding treatment and the denitrification treatment were bonded to each other without being isolated from each other, and there was no gap to allow desorption of N. In this case, although a relatively large coercive force is obtained, a bonding portion between particles is present as a sintered portion that generates a random phase, and a soft magnetic portion including N is included, which may cause a decrease in the coercive force.

On the other hand, the example 1 had the coercive force of 1160 Oe (i.e., 92.3 kA/m), and the second example 2 had the coercive force of 2217 Oe (i.e., 176.4 kA/m). In addition, the example 3 had the coercive force of 2004 Oe (i.e., 159.5 kA/m), and the example 4 had the coercive force of 1691 Oe (i.e., 134.6 kA/m). Further, the example 5 had the coercive force of 1426 Oe (i.e., 113.5 kA/m). Also in the examples 1 to 5, the designed film thickness of the particles 3a of the FeNi disordered alloy was differentiated in the range from 10 to 50 nm. Therefore, the examples 1 to 5 had different coercive forces. However, all of the examples 1 to 5 had the desired coercive forces. The example 6 had the coercive force of 2245 Oe (i.e., 178.6 kA/m). In this way, even when the substrate 2 was provided by the silicon substrate having the thermal oxide film thereon, it was possible to achieve a high coercive force.

As can be seen from the above, as in the examples 1 to 6, the FeNi ordered alloy structural body 1 having a high coercive force can be manufactured by arranging the particles of the FeNi disordered alloy so as to be dispersed on the substrate 2 and then performing the nitriding treatment and the denitrification treatment. In the examples 1 to 6, the nitriding treatment and the denitrification treatment were performed. In the examples 3 to 5, it was confirmed that N remained, and the nitride proportion was 11 wt %, 25 wt %, and 40 wt %, respectively. In the examples 3 to 5, since N remained, the coercive force was smaller than that in the example 2 in which N was not confirmed to remain. However, all of the examples 3 to 5 had the high coercive force of 1400 Oe or more. In addition, the nitride proportion wt % increases with the increase in the designed film thickness. This is because it is difficult for N present inside the particle to desorb from the upper surface of the particle. Therefore, when at least the designed film thickness is 50 nm or less, that is, the actual thickness of the particle 3 is 75 nm or less, a high coercive force can be obtained. Note that it is not always necessary that the dispersed particle 3a is perfect disordered alloy. The dispersed particle 3a may be partially ordered alloy or may contain N.

Further, various measurements were performed in each process in each of the above examples. In the following description, the measurements performed for some of the examples will be described as an example, but similar results were obtained also for the other examples.

Figure 10:
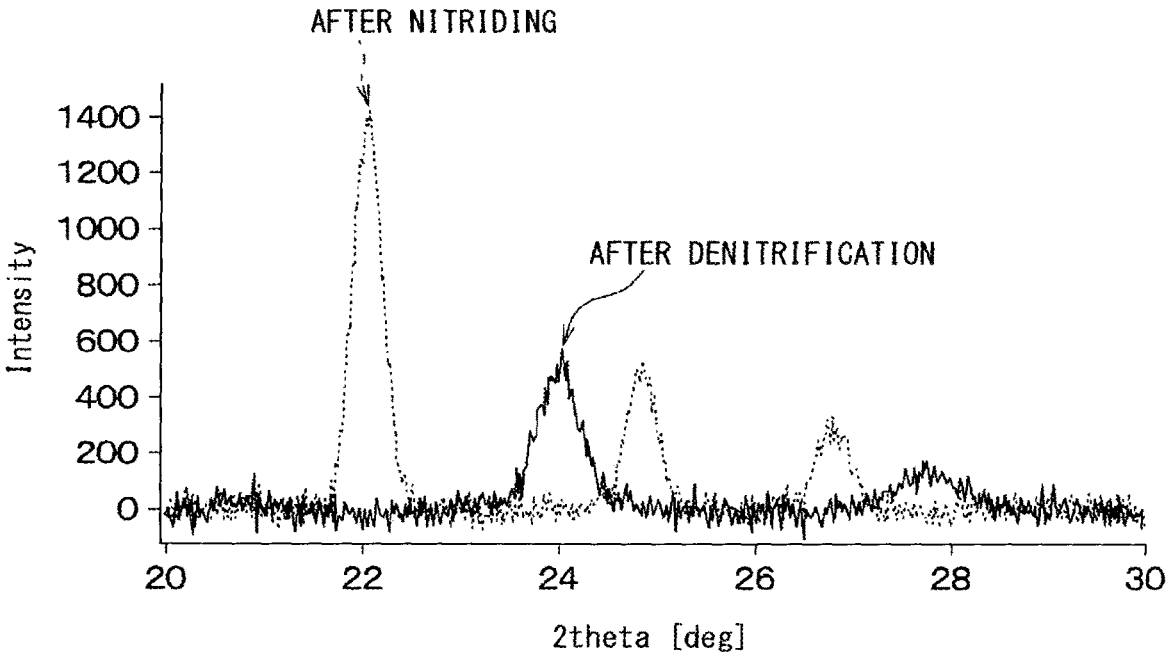
FIG. 10 is a diagram illustrating measurement results by an X-ray crystal structure analysis (XRD) after the nitriding treatment and the denitrification treatment to the particles of the FeNi disordered alloy.

First, in the example 2, measurement based on an X-ray diffraction measurement method was performed after each process, that is, every after the nitriding treatment of the particles 3a of the FeNi disordered alloy and the denitrification treatment. The X-ray diffraction measurement was performed using an XRD apparatus that performs thin film X-ray diffraction of the beamline BL8S1 at the Aichi Synchrotron Optical Center. FIG. 10 shows the measurement results. In the XRD apparatus used, X-rays having a radiation energy of 14.37 keV and a wavelength of 0.08629 nm (A=0.08629) were used. The incident angle was adjusted to 0.2° relative to the substrate 2 of the 5 mm square, and in-plane measurement was performed. Then, based on the X-ray diffraction pattern indicated by the result of FIG. 10, the Scherrer diameter after the nitriding treatment or the denitrification treatment was derived. Regarding the derivation of the Scherrer diameter, a main peak of the obtained diffraction pattern, specifically, a peak around 22.1 deg after the nitriding treatment, and 24.1 deg after the denitrification treatment were fitted with a Gaussian function to obtain a full width at half maximum, and the Scherrer diameter was estimated using the Scherrer equation.

Figure 11:
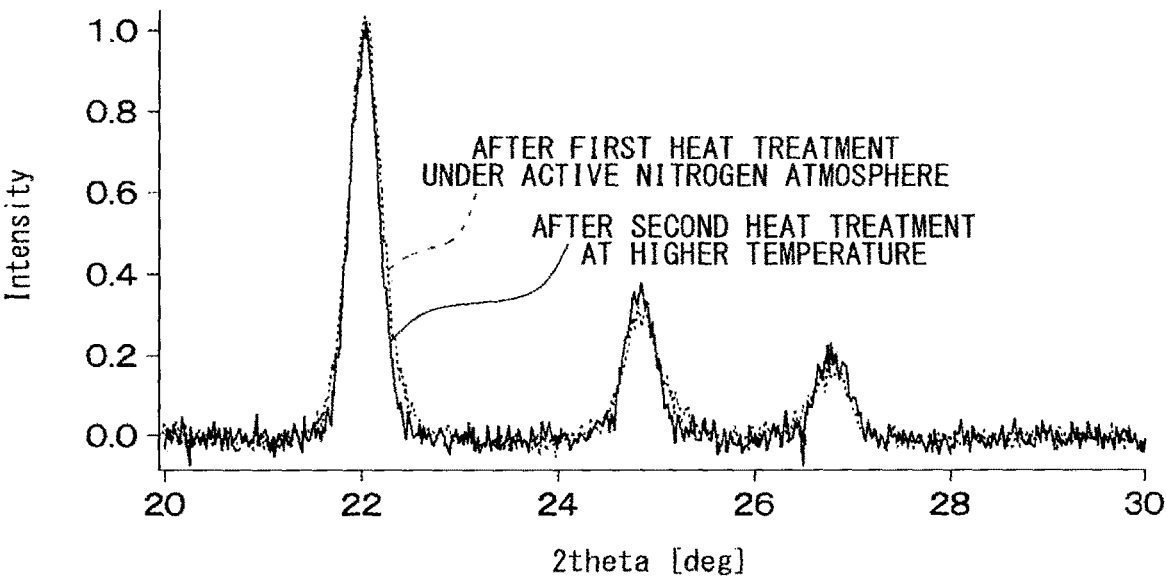
FIG. 11 is a diagram illustrating measurement results by the XRD after a first heat treatment and a second heat treatment in an $NH_3$ gas atmosphere.

Regarding the nitriding treatment, X-ray diffraction measurement was performed in the same manner also after a heat treatment at 325° C. for 20 hours was performed in an $NH_3$ gas nitrogen atmosphere as a first heat treatment, and the result shown in FIG. 11 was obtained. For reference, FIG. 11 also shows the result of the X-ray diffraction measurement after the heat treatment at 375° C. for 20 hours in the $NH_3$ gas atmosphere as a high-temperature heat treatment of the second time. The Scherrer diameter after the first heat treatment was also derived in the same manner as described above.

As a result, the Scherrer diameter after the nitriding treatment was 21.0±0.4 nm, and the Scherrer diameter after the denitrification treatment was 10.3±0.1. After the denitrification treatment, a $Fe_2Ni_2N$ phase, which was generated when N remained, was not confirmed. Thus, it was confirmed that the denitrification was done.

In addition, the Scherrer diameter after the first heat treatment in the $NH_3$ gas atmosphere was 16.1±0.1 nm. As described above, after nitriding was performed by the first heat treatment in the $NH_3$ gas atmosphere in the nitriding treatment, the crystallite size was increased by the second heat treatment at a high temperature in the $NH_3$ gas atmosphere. This means that crystal growth occurs by the second high-temperature heat treatment in the $NH_3$ gas atmosphere, which is performed as the additional high-temperature treatment. In this way, by performing the additional high-temperature treatment, crystal growth can be promoted and crystallinity can be further improved.

The Scherrer diameter does not mean the size of the islanded particle 3 per se, but means the average size of microcrystalline composed of single crystals contained in the particle 3. The Scherrer diameter also tends to decrease with an increase in strain or the like. When the islanded particle 3 is all composed of a single crystal, the size of the particle 3 is the crystallite size. However, in a case where a plurality of microcrystals are gathered in the particle 3, since the size of each microcrystal is the crystallite size, the size of each microcrystal does not necessarily coincide with that of the islanded particle 3. However, the Scherrer diameter is a value serving as a criterion of crystallinity.

Figure 12:
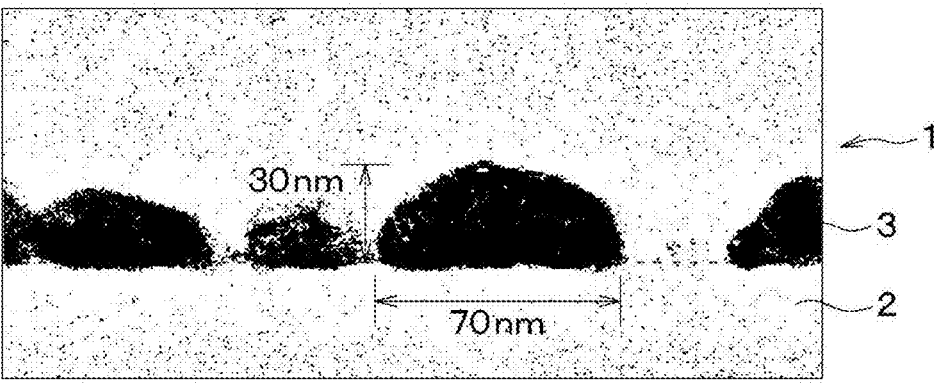
FIG. 12 is a diagram illustrating a result of a transmission electron microscope (TEM) observation of a cross-section of the example 2 using the (TEM)

The cross section of the example 2 was observed by TEM. Specifically, after carbon vapor deposition was performed on the obtained sample, the sample was thinned to a thickness of about 100 nm using a focused ion beam, and the cross section was observed at an acceleration voltage of 300 kV using a JEM-ARM 300 F manufactured by JEOL as the TEM. As a result, a cross-sectional TEM image of FIG. 12 was obtained.

As a result of the observation of the cross-sectional TEM image, the dimensions of the particle 3 of the FeNi ordered alloy were 30 nm in the normal direction to the surface 2a of the substrate 2 as the support and 70 nm in the horizontal direction.

Further, as a result of composition analysis by energy dispersive X-ray analysis, the atomic concentration ratios of Fe, Ni, and N were equal to or less than 50.2±4.2 at %, 49.8±4.4 at %, and lower than 0.1 at %, which is a detection limit, respectively. From this, it can be confirmed that the particle 3 of the FeNi ordered alloy structural body 1 produced as described above contains an $L1_0$ type FeNi ordered alloy phase.

Figure 13:
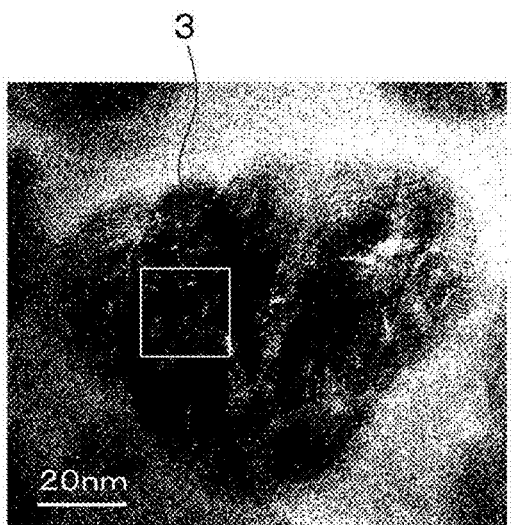
FIG. 13 is a diagram illustrating isolated FeNi particles in a planar TEM image of particles of an FeNi ordered alloy.
Figure 14:
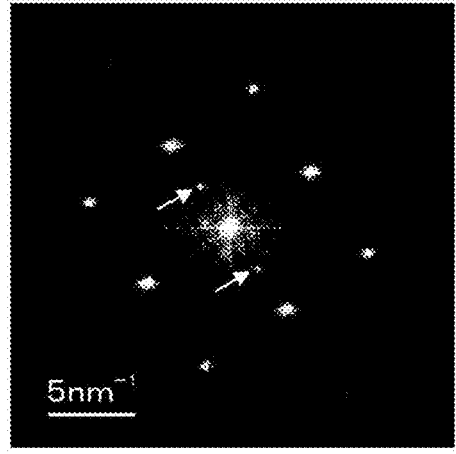
FIG. 14 is a diagram illustrating a reciprocal lattice image obtained by capturing a high-resolution transmission electron microscope image in a region of 20 nm square in FIG. 13 and performing a fast Fourier transform.

A planar TEM observation was also performed. In this case, after carbon deposition is performed to the obtained sample, the sample was thinned from the back surface to a thickness of about 100 nm using a focused ion beam. Then, the sample was observed using the TEM described above at an accelerating voltage of 300 kV. FIG. 13 shows the results of observation of isolated FeNi grains in the planar TEM image. Further, a high resolution transmission electron microscope image of a region of 20 nm square is taken from the image of FIG. 13, and subjected to fast Fourier transform to obtain a reciprocal lattice image, which is shown in FIG. 14.

From this result, 001 spots derived from the superlattice were detected, and it was confirmed that the superlattice structure was formed. Furthermore, it was confirmed that 72% or more of the particle were in the same direction by narrowing the 002 spot and taking a dark field image. Here, since the diffraction spot has a spread, the accuracy of the c-axis is within ±5°. From this, it can be said that the particles 3 in the FeNi ordered alloy structural body 1 manufactured as in the present embodiment have a particle size of 5 to 200 nm, and 72% or more of the volume of at least one of the particles 3 can be oriented in the same direction in which the deviation of the c-axis is within ±5°.

Figure 15:
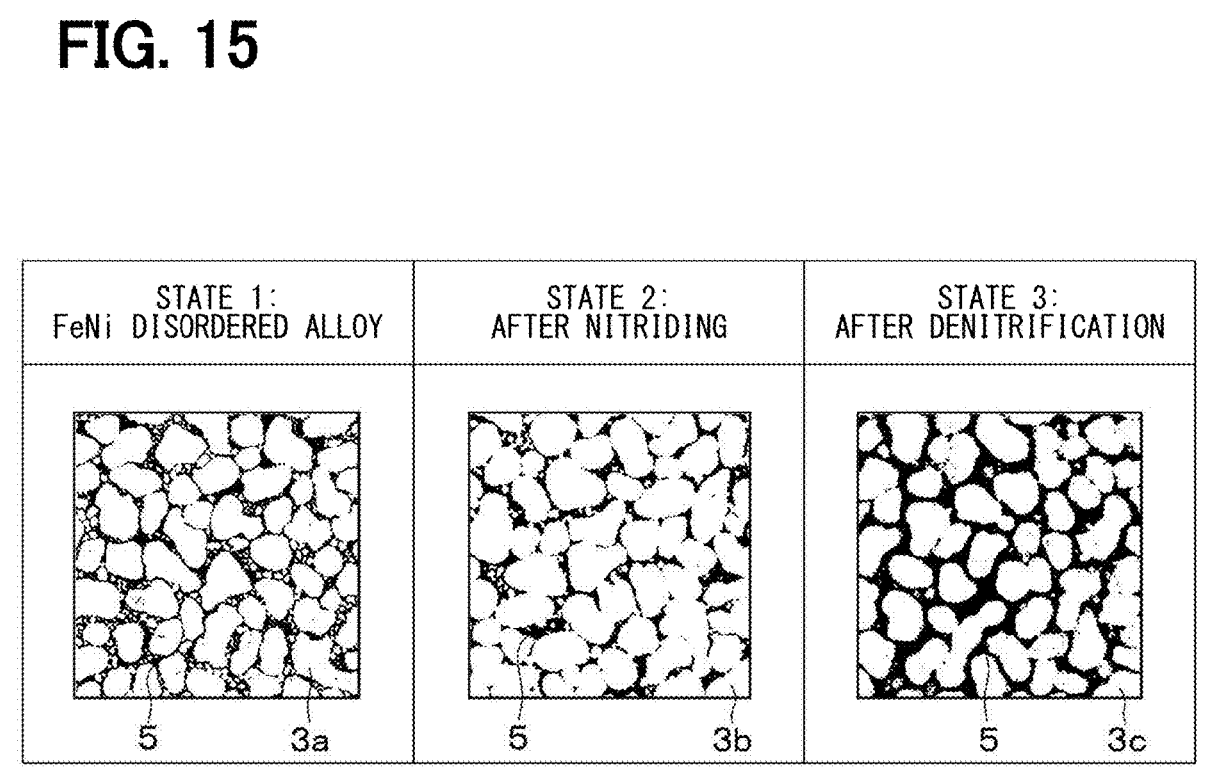

Also in the example 2, TEM observation was performed to the upper surface of the substrate 2. FIG. 15 is the TEM observation image and corresponds to the actual image of FIG. 7 described above. In the state where the particles 3a of the FeNi disordered alloy shown in the state 1 of FIG. 15 were arranged on the surface 2a of the substrate 2, the gap 5 between the particles 3a was approximately 0.3 nm or more although the gap 5 was partially narrowed. The average occupied area of the particles 3a per unit area was confirmed to be 76.9%.

Similarly, as shown in the state 2 of FIG. 15, even in a state where the particles 3b in which N is incorporated into FeNi were generated by performing the nitriding treatment, the gap 5 between the particles 3b was approximately 0.3 nm or more although the gap 5 was partially narrowed. The average occupied area of the particles 3b per unit area was confirmed to be 79.9%. The volume expansion of the particle 3b was about 30% due to the incorporation of N and crystal growth, as compared with the volume expansion of the particle 3a of the FeNi disordered alloy. In addition, when the image was checked, crystal was grown while incorporating fine particles existing around each particle 3*b* into the particle 3*b*, and the gap 5 between the particles 3*b* was further enlarged.

Further, as shown in the state 3 of FIG. 15, when the denitrification treatment was performed to desorb N from the particle 3*b* in which N has been incorporated into FeNi, the particles 3*c* including the FeNi ordered alloy phase of the $L1_0$ type having the ordered structure of the $L1_0$ type are generated. In addition, the volume of the particle 3*c* at this time was smaller than that of the particle 3*c* in which N was incorporated into FeNi. It can be said that the volume of the particle 3*c* is reduced because the volume shrinkage occurs due to the desorption of N and the particle 3*c* is cut at the grain boundary portion or the amorphous portion having a weak bonding force. The average occupied area of the particles 3*c* per unit area was confirmed to be 71.6%, and the dimension of the gap 5 between the particles 3*c* was approximately 0.3 nm or more although it was partially narrowed. The gap 5 was wider as a whole than that shown in state 2 of FIG. 15 before the denitrification treatment.

In addition, the magnetic characteristics of the example 2 were examined. Specifically, a longitudinal Kerr effect measurement and an in-plane VSM measurement were performed, and the results shown in FIGS. 16A and 16B were obtained. The longitudinal Kerr effect measurement was performed at room temperature of 300 K. The in-plane VSM measurement was performed at 50 K which was lower than the room temperature and at 600 K which was higher than the room temperature. As a result of the longitudinal Kerr effect measurement, the coercive force of 2217 Oe was obtained. As a result of the in-plane VSM measurement, since the coercive force of 2312 Oe (i.e., 184.0 kA/m) was obtained at a low temperature of 50 K, it was possible to obtain a higher coercive force. In addition, the coercive force of 1715 Oe (i.e., 136.5 kA/m) was obtained at a high temperature of 600 K, and it is thus possible to obtain a coercive force performance in a wide temperature range. The saturation magnetization Ms was 1.37 T at 50 K and 0.97 T at 600 K.

Figure 16A:
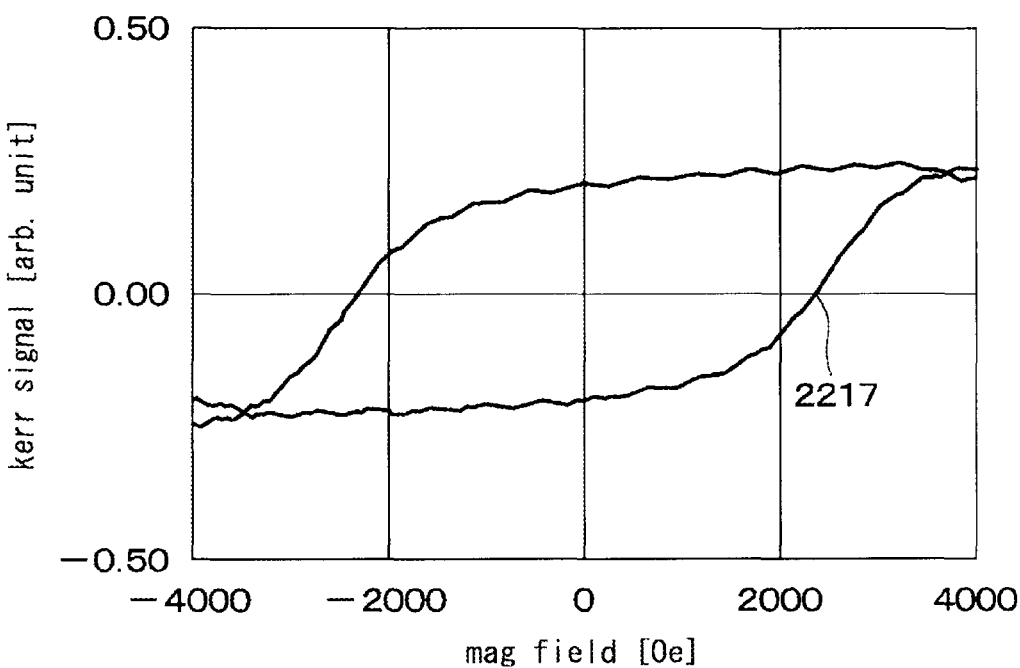
FIG. 16A is a diagram illustrating a result of measurement of a longitudinal Kerr effect.
Figure 16B:
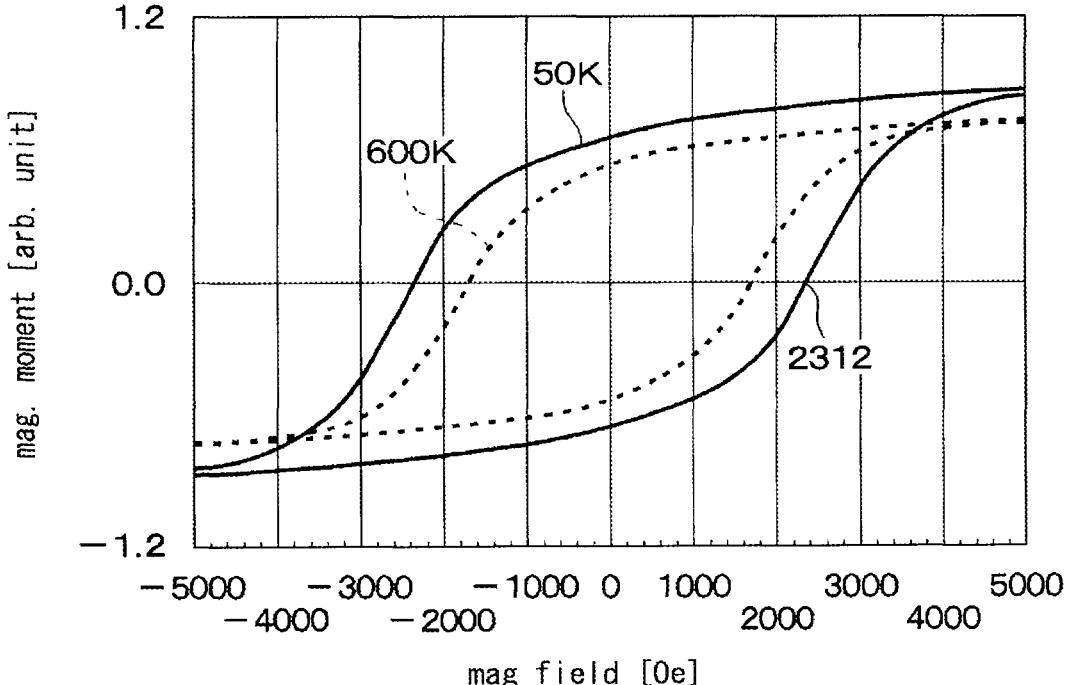
FIG. 16B is a diagram illustrating a result of in-plane vibrating sample magnetometer (VSM) measurement.

Note that the coercive force shown in the diagram of FIG. 9 shows a result obtained when the longitudinal Kerr effect measurement as shown in FIG. 16A is performed. Also in the examples 1 and 3 to 5 other than the example 2, a higher coercive force was obtained when the in-plane VSM measurement was performed.

Using the sample of the example 5, the relationship between the thickness of the particle 3 and the easiness of denitrification was also examined. As shown in FIG. 10, as a result of examining the nitride proportion wt % when the nitriding treatment and the denitrification treatment were performed on the particles 3*a* of the FeNi disordered alloy while changing the designed film thickness, the nitride ratio wt % increased as the designed film thickness increased. This is because as the thickness of the particle 3*a* increases, N is less likely to be desorbed.

In the example 5, the designed film thickness of the particle 3*a* is 50 nm. As described above, the designed film thickness is the film thickness in the case of being formed into a film shape at the time of vapor deposition, and the actual thickness of the particles 3*a* after being formed into islands is about 1.5 times the designed film thickness, and is about 75 nm at the maximum. Among the particles 3 in the example 5, a particle having a portion where the thickness of 50 nm or less and a portion thicker than the portion where the thickness of 50 nm or less was extracted, and it was examined whether denitrification was performed. Specifically, after carbon vapor deposition was performed on the obtained sample, the sample was thinned to a thickness of about 100 nm using a focused ion beam, and the cross section of the obtained sample was observed at an acceleration voltage of 300 kV using the TEM described above. As a result, a cross-sectional scanning transmission electron microscope (STEM) image and an elemental composition image of nitrogen shown in FIGS. 17 A and 17 B were obtained.

Figure 17A:
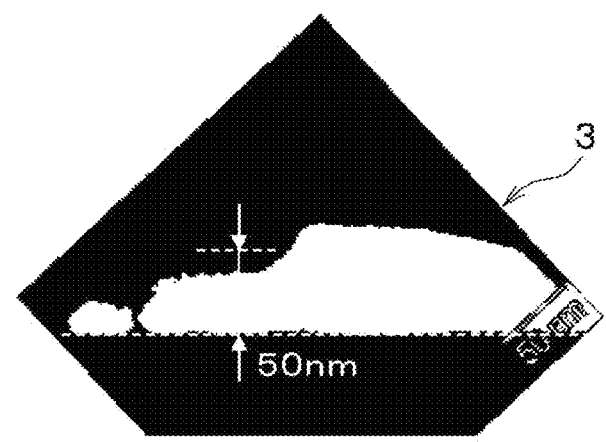
FIG. 17A is a diagram illustrating a cross-sectional scanning transmission electron microscope image.
Figure 17B:
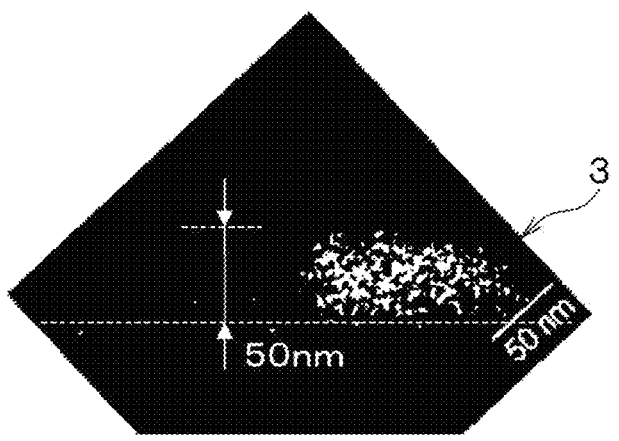
FIG. 17B is a diagram illustrating a composition image of nitrogen.

When FIGS. 17A and 17B were compared, it was found that nitrogen was not detected when the film thickness was 50 nm or less, whereas nitrogen was detected inside in a region having a film thickness of 50 nm or more. From this, it can be said that when the actual thickness of the particle 3*a* is 50 nm or less, the desorption of N can be performed more accurately. Therefore, a high coercive force can be obtained even when the actual thickness of the particles 3*a* is about 75 nm at the maximum. However, when the actual thickness of the particle 3*a* is 50 nm or less, a higher coercive force can be obtained.

As described above, the FeNi ordered alloy structural body 1 of the present embodiment has a structure in which the particles 3 containing the $L1_0$ type FeNi ordered alloy phase are arranged on the substrate 2 with the gaps 5 therebetween. In such an FeNi ordered alloy structural body 1, each particle 3 can be isolated in a form close to a single crystal, and generation of a random phase can be suppressed. Therefore, a high coercive force can be obtained. Specifically, a high coercive force of 1160 Oe (i.e., 92.3 kA/m) or more can be obtained.

Furthermore, according to the FeNi ordered alloy structural body 1 of the present embodiment or the manufacturing method thereof, the following effects can also be obtained.

(1) The FeNi ordered alloy structural body 1 of the present embodiment is obtained by performing the denitrification treatment after the nitriding treatment of the FeNi disordered alloy. Since the gaps 5 that allows the $NH_3$ molecules to pass through are formed, it is possible to accurately desorb N during the denitrification treatment. Therefore, it is possible to obtain the particles 3 in which the remaining of N is suppressed, and it is possible to obtain a higher coercive force.

(2) The particle 3 in the FeNi ordered alloy structural body 1 has a particle size of 5 to 200 nm, and 72% or more of the volume of at least one of the particles 3 is oriented in the same direction in which the deviation of the c-axis is within ±5°. This also makes it possible to obtain a higher coercive force.

(3) In addition, in the FeNi ordered alloy structural body 1 of the present embodiment, the substrate 2 serving as the support is provided by a quartz substrate. The quartz substrate is made of the material having the coefficient of linear expansion smaller than that of FeNi. Therefore, based on the difference in coefficient of linear expansion between FeNi and the substrate 2, the gaps 5 between the particles 3 can be widened at the time of lowering the temperature after the nitriding treatment and the denitrification treatment, and the particles 3 can be easily separated and magnetically isolated from each other.

(4) In the method for manufacturing the FeNi ordered alloy structural body 1 of the present embodiment, in the nitriding treatment, one heat treatment in an active nitrogen atmosphere and an additional heat treatment at a high temperature are performed. That is, the nitriding treatment includes a first heat treatment and a second heat treatment. The first heat treatment in the active nitrogen atmosphere is performed at a temperature in the range of 200 to 400° C., and the second heat treatment at a high temperature is performed at a temperature higher than that of the first heat treatment. For example, the first heat treatment is performed at a temperature lower than 350° C., and the second heat treatment is performed at a temperature higher than or equal to 350° C.

As described above, when the first heat treatment is performed at a relatively low temperature, FeNiN is easily generated when N is incorporated into FeNi while the structure of the metal element arrangement of the FeNi ordered alloy is obtained at the stage of the nitriding treatment. In addition, by performing the second heat treatment at a relatively high temperature, crystal growth occurs, and it is possible to further increase the particle size of the particles $3b$ and to further improve the crystallinity.

Other Embodiments

While the present disclosure has been described in accordance with the embodiments described above, the present disclosure is not limited to the embodiments and includes various modifications and equivalent modifications. In addition, the present disclosure is not limited to magnetic materials, and various combinations and forms, and other combinations and forms including only one element, more elements, or less elements are also included in the scope and spirit of the present disclosure.

For example, in the embodiment described above, the quartz substrate which is made of the material having the coefficient of linear expansion smaller than that of FeNi is used as the substrate 2 serving as the support. However, it is not always necessary that the substrate 2 is made of a material having a small coefficient of linear expansion.

In addition, the case where the particle size of the particle 3 is 5 to 200 nm has been exemplified, but this indicates a preferable range. In the present disclosure, it is sufficient that the particles 3 are configured to be separated from each other by the gap 5, and the $L1_0$ type FeNi ordered alloy phase is contained in at least a part of each particle 3.

Although the substrate 2 has been exemplified as the support having the surface $2a$ on which the particles 3 are formed, the support is not necessarily in the form of a substrate. For example, the support may have a curved or uneven shape.

Although the case where the chemical composition ratio of Fe and Ni satisfies Fe:Ni=50:50 has been described as an example, this ratio is not necessarily required. For example, as the chemical composition ratio, the proportion of Fe may be 40 to 60% and the proportion of Ni may be 60 to 40%.

What is claimed is:

1. A FeNi ordered alloy structural body, comprising:
a support having a surface; and
a plurality of particles dispersed on the surface of the support with gaps therebetween, each of the particles containing a FeNi ordered alloy phase of an $L1_0$ ordered structure.

2. The FeNi ordered alloy structural body according to claim 1, wherein
each of the gaps has a dimension larger than a $NH_3$ molecule to allow the $NH_3$ molecule to pass therethrough.

3. The FeNi ordered alloy structural body according to claim 2, wherein
the dimension of each of the gaps is equal to or larger than 0.3 nm at least at a part of the gap.

4. The FeNi ordered alloy structural body according to claim 3, wherein
the particles each have a particle size of 5 nm to 200 nm, and
the particles are dispersed so that at least one gap is present in each area having a diameter of 300 nm and including at least one of the particles on the surface of the support.

5. The FeNi ordered alloy structural body according to claim 2, wherein
the support is made of a material that has a coefficient of linear expansion smaller than that of FeNi for all temperatures in a temperature range from 27 degrees Celsius to 400 degrees Celsius.

6. The FeNi ordered alloy structural body according to claim 5, wherein
the coefficient of linear expansion of the material of the support is smaller than $9.0 \times 10^{-6}$/K for all temperatures in a temperature range from 27 degrees Celsius to 400 degrees Celsius.

7. The FeNi ordered alloy structural body according to claim 5, wherein
the coefficient of linear expansion of the material of the support is smaller than $5.0 \times 10^{-6}$/K for all temperatures in a temperature range from 27 degrees Celsius to 400 degrees Celsius.

8. The FeNi ordered alloy structural body according to claim 2, wherein
the particles include at least one particle in which at least 72% of its volume has a c-axis oriented in a same direction within a deviation of ±5°.

9. The FeNi ordered alloy structural body according to claim 1, wherein
each of the particles has a thickness of 75 nm or less in a normal direction to the surface of the support.

10. The FeNi ordered alloy structural body according to claim 1, wherein
each of the particles has a thickness of 50 nm or less in a normal direction to the surface of the support.

11. The FeNi ordered alloy structural body according to claim 1, wherein
a coercive force is 92.3 kA/m or more at 300 K.

12. A method for manufacturing a FeNi ordered alloy structural body, comprising:
preparing a support having a surface;
forming particles of an FeNi disordered alloy to be dispersed with gaps therebetween on the surface of the support;
performing a nitriding treatment to the particles of the FeNi disordered alloy so as to form particles in which nitrogen is incorporated;
after the performing the nitriding treatment, performing a denitrification treatment to desorb the nitrogen from the particles, thereby to form particles containing an $L1_0$ FeNi ordered alloy phase of an $L1_0$ ordered structure.

13. The method according to claim 12, wherein
the performing the nitriding treatment includes:
performing a first heat treatment in an active nitrogen atmosphere at a predetermined temperature; and
after the performing the first heat treatment, performing a second heat treatment at a temperature higher than the predetermined temperature.

14. The method according to claim 13, wherein
the predetermined temperature is in a range from 200 degrees Celsius to 400 degrees Celsius.

* * * * *